United States Patent
Kubouchi et al.

(10) Patent No.: US 8,699,256 B2
(45) Date of Patent: Apr. 15, 2014

(54) SEMICONDUCTOR DEVICE HAVING NONVOLATILE MEMORY ELEMENTS

(75) Inventors: Shuichi Kubouchi, Tokyo (JP); Hiroki Fujisawa, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 335 days.

(21) Appl. No.: 12/923,165

(22) Filed: Sep. 7, 2010

(65) Prior Publication Data
US 2011/0058402 A1    Mar. 10, 2011

(30) Foreign Application Priority Data
Sep. 8, 2009 (JP) ................................ 2009-207185

(51) Int. Cl.
*G11C 17/00* (2006.01)
(52) U.S. Cl.
USPC .......................... 365/96; 365/225.7; 365/200
(58) Field of Classification Search
USPC .................. 365/225.7, 96, 200, 103, 230.03, 365/230.06, 203, 222, 228, 229, 185.25
See application file for complete search history.

(56) References Cited

U.S. PATENT DOCUMENTS

| | | | |
|---|---|---|---|
| 6,240,033 B1 * | 5/2001 | Yang et al. | 365/225.7 |
| 6,667,905 B2 * | 12/2003 | Dono et al. | 365/185.08 |
| 7,349,281 B2 | 3/2008 | Kouchi et al. | |
| 7,706,202 B2 * | 4/2010 | Obayashi et al. | 365/225.7 |
| 2002/0136047 A1 * | 9/2002 | Scheuerlein | 365/96 |
| 2003/0043652 A1 * | 3/2003 | Yamauchi | 365/200 |
| 2009/0196113 A1 * | 8/2009 | Jeong | 365/200 |

FOREIGN PATENT DOCUMENTS

JP    2007-80302    3/2007

* cited by examiner

*Primary Examiner* — Toan Le
(74) *Attorney, Agent, or Firm* — McGinn IP Law Group, PLLC

(57) ABSTRACT

A bit memory circuit of an antifuse element set includes two antifuse elements of which logical states are changed from an insulation state to a conductive state when a program voltage is applied. 1-bit data is represented by the logical states of the two antifuse elements. The two antifuse elements are collectively controlled by one decoder circuit. When writing data, the decoder circuit simultaneously performs insulation-breakdown on the two antifuse elements by simultaneously connecting the two antifuse elements to program voltage lines, respectively.

32 Claims, 11 Drawing Sheets

SEMICONDUCTOR DEVICE HAVING NONVOLATILE MEMORY ELEMENTS

BACKGROUND OF THE INVENTION

1. Field of the Invention

The present invention relates to a semiconductor device, and more particularly to a semiconductor device that stores a defective address by a nonvolatile memory element.

2. Description of Related Art

In a semiconductor memory device such as a DRAM (Dynamic Random Access Memory), the number of memory cells that do not function properly (hereinafter, "defective cells") increases with an increase of a memory density. To solve this problem, auxiliary memory cells called "redundant cells" are prepared in advance in the semiconductor memory device. By replacing a defective cell with a redundant cell, a memory address of the defective cell (hereinafter, "defective address") is saved. A detection of the defective cell and a replacement with the redundant cell are performed in a wafer state at a time of manufacturing the semiconductor memory device. Specifically, the defective address is detected at an operation test that is performed in the wafer state, and the detected defective address is stored in an address storing circuit included in the semiconductor memory device. With this mechanism, when the defective address is designated as an access destination, the redundant cell becomes an actual access destination instead of the defective cell, by which the defective address is saved.

In many cases, a fuse element is used as a memory element for storing the defective address. The fuse element is electrically in a conductive state in the initial state and is changed to a nonconductive state (an insulation state) with line-breaking by an irradiation with a laser beam. Information of one bit can be represented by the conductive state and the nonconductive state of one fuse element. Therefore, by irradiating a plurality of fuse elements with the laser beam in a selective manner, a desired defective address can be stored in a nonvolatile manner. The process of storing the defective address in the fuse elements is called "programming".

However, the fuse element has a problem that a passivation layer is collaterally damaged at a time of an irradiation with the laser beam. Because of this problem, in recent years, a nonvolatile memory element called an antifuse element is used to save the defective address. The antifuse element is in a nonconductive state in an initial state and is changed to a conductive state with an insulation-breakdown by an application of a high voltage. The change of resistance in the antifuse element before and after programming is opposite to that in the fuse element. Because the passivation layer is not damaged at a time of the programming, the reliability of a product can be enhanced.

However, the antifuse element has a problem of its memory stability because the state of the antifuse element can be returned from the conductive state to the nonconductive state with time. To deal with this problem, a method of enhancing the memory stability has been proposed, in which two or more antifuse elements are assigned per bit, and if at least one antifuse element is in an insulation-breakdown state, it is determined that the bit is in a programmed state (see, for example, Japanese Patent Application Laid-open No. 2007-80302).

FIG. 10 is a circuit diagram showing an example of a conventional antifuse memory circuit in which two antifuse elements are assigned per bit. An antifuse memory circuit 150 shown in FIG. 10 is a circuit for storing 1-bit data. The antifuse memory circuit 150 includes two sets of an antifuse element AF, a driver transistor DR, a load transistor LD, and a decoder circuit 100. In the following explanations, when collectively referring to antifuse elements AF(A) and AF(B) or making no distinction between them, it is simply called "antifuse element AF". The same goes for other elements.

The anti fuse element AF is a PMOS (Positive channel Metal Oxide Semiconductor) transistor in which a source and a drain are short circuited, and a gate insulation is in any one of a non-breakdown state (hereinafter, "first logical state") or a breakdown state (hereinafter, "second logical state"). The initial state is the first logical state.

Source-drain connection nodes of the antifuse elements AF(A) and AF(B) are commonly connected to a predetermined voltage line VBBSVT. A potential of the voltage line VBBSVT is called "reference potential". Gates of the antifuse elements AF(A) and AF(B) are commonly connected to a predetermined voltage line VPPSVT via driver transistors DR(A) and DR(B), respectively. A potential of the voltage line VPPSVT is called "program potential".

Decoder circuits 100A and 100B are connected to gates of the driver transistors DR(A) and DR(B), respectively. When a write signal AFWRT is asserted in a state where a row address signal XA indicates a predetermined value, the decoder circuits 100A and 100B switch on the driver transistors DR(A) and DR(B), respectively. When the driver transistors DR(A) and DR(B) are switched on, the program voltage VPPSVT is applied to the antifuse elements AF(A) and AF(B), so that an insulation-breakdown of gate insulation layers occurs. As a result, the states of the antifuse elements AF(A) and AF(B) are changed from the first logical state to the second logical state. Of course, the program voltage VPPSVT needs to be high enough to achieve the insulation-breakdown of the antifuse element AF.

When a load signal LOAD is asserted, both load transistors LD(A) and LD(B) are switched on. At this time, a determining circuit 120 detects gate potentials of the antifuse elements AF(A) and AF(B). A detected potential is different according to the states of the antifuse elements AF(A) and AF(B), whether both of them are in the first logical state or at least one of them is in the second logical state. In this manner, the antifuse memory circuit 150 represents 1-bit data by taking a wired OR of the two antifuse elements AF(A) and AF(B).

Normally, the logical states of the antifuse elements AF(A) and AF(B) coincide with each other. However, even when both the driver transistors DR(A) and DR(B) are switched on, there can be a case where only one of the antifuse elements AF(A) and AF(B) succeeds in the insulation-breakdown. In this case, a re-application of the program voltage can solve the problem. For example, assume that the insulation-breakdown of the antifuse element AF(B) fails while the insulation-breakdown of the antifuse element AF(A) is successful. In this case, when the decoder circuit 100B switches on the driver transistor DR(B) with the decoder circuit 100A switching off the driver transistor DR(A), it becomes possible to apply the program voltage only to the driver transistor DR(B) for which the insulation-breakdown failed. Because the two driver transistors DR(A) and DR(B) can be individually controlled by the two decoder circuits 100A and 100B, it is easy to achieve the insulation-breakdown for both the antifuse elements AF(A) and AF(B) without fail.

FIG. 11 is a circuit diagram showing another example of a conventional antifuse memory circuit in which two antifuse elements are assigned per bit. In an antifuse memory circuit 152 shown in FIG. 11, not only the decoder circuit 100 is provided for each antifuse element AF, but also the determining circuit 120 is provided for each antifuse element. Outputs of determining circuit 120A and 120B are subject to a logical sum by an OR gate 122.

In the case of the antifuse memory circuit 152, an output of the OR gate 122 is changed according to the states of the antifuse elements AF(A) and AF(B), whether both of them are in the first logical state or at least one of them is in the second logical state. The basic operation principle is the same as that of the antifuse memory circuit 150 shown in FIG. 10.

However, because the decoder circuit 100 is assigned for each antifuse element AF in the antifuse memory circuits 150 and 152, there is a problem that an occupation dimension of the decoder circuit 100 is large. Such a problem can occur not only in a semiconductor memory device employing the antifuse element AF, but also in general semiconductor devices including a nonvolatile memory element in which information is stored by an application of the program voltage.

SUMMARY

In one embodiment, there is provided a semiconductor device that includes a plurality of nonvolatile memory elements, a plurality of program voltage lines respectively assigned to the nonvolatile memory elements, a plurality of driver circuits each connected between corresponding one of the nonvolatile memory elements and corresponding one of the program voltage lines and a decoder circuit that applies a program voltage to the nonvolatile memory elements by commonly switching on the driver circuits in response to an address signal indicating a predetermined value.

In another embodiment, there is provided a semiconductor device that includes a fuse circuit that includes at least two fuse elements and that generates a signal taking a first logical level when all the fuse elements are in a first state and a second logical level when at least one of the fuse elements is in a second state. The semiconductor device includes a selection circuit that simultaneously selects all the fuse elements based on select information, a programming circuit that applies a program voltage to selected fuse elements to cause each of the selected fuse elements to be in the second state and a suppression circuit that suppresses transfer of a change of the program voltage with a change of a state of one of the fuse elements to the second state to other one of the fuse elements.

According to the present invention, because a program voltage line is assigned for each of a plurality of nonvolatile memory elements, even when a program is complete (for example, insulation-breakdown) early in any one of the nonvolatile memory elements, a sufficient program voltage is continuously applied to the other nonvolatile memory elements. Therefore, it is possible to assign a plurality of nonvolatile memory elements to one decoder circuit. Because the number of required decoder circuits decreases, it is possible to reduce a chip dimension.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
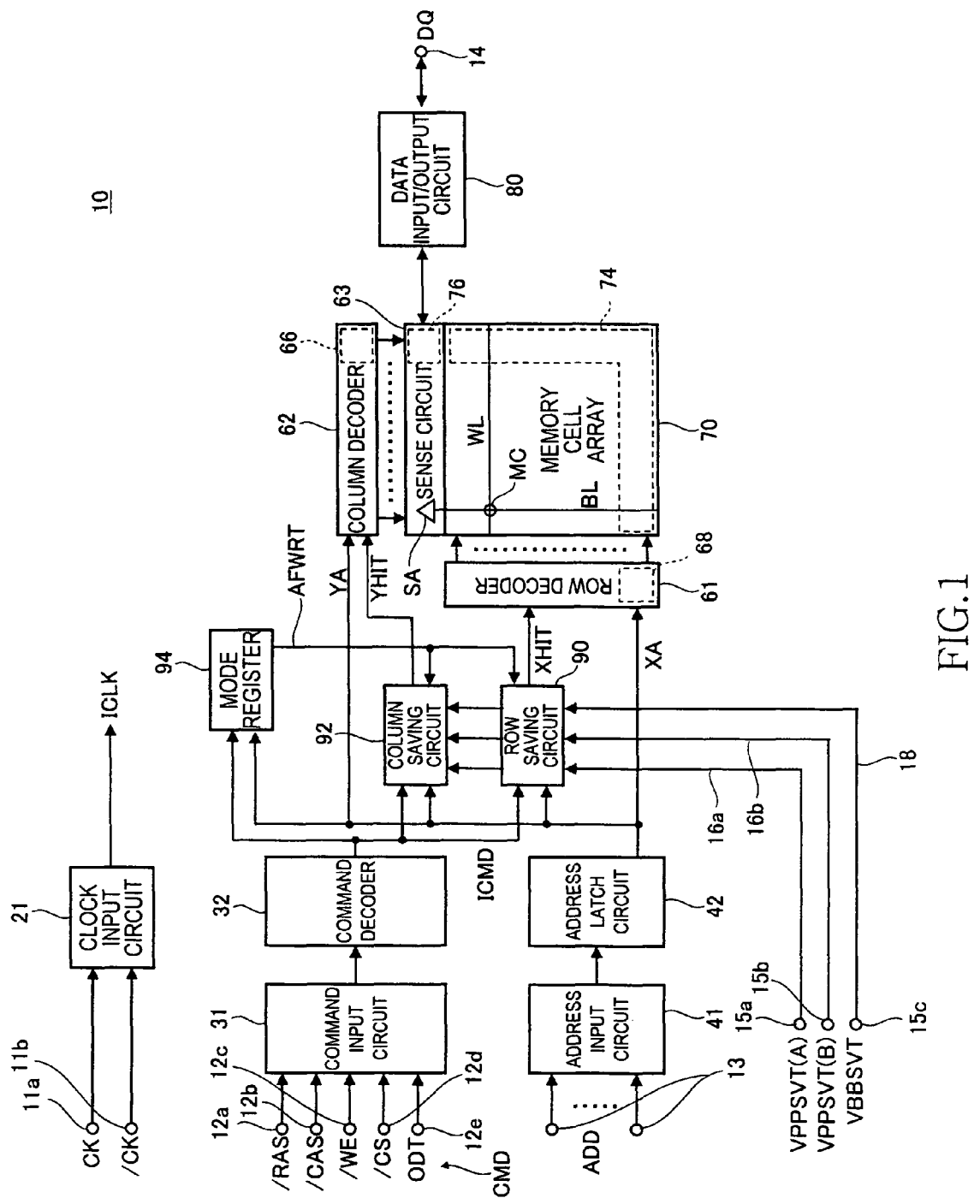
FIG. 1 is a functional block diagram of a semiconductor memory device according to an embodiment of the present invention.

FIG. 1 is a functional block diagram of a semiconductor memory device 10 according to an embodiment of the present invention. The semiconductor memory device 10 is a DDR (Double-Data-Rate) SDRAM (Synchronous Dynamic Random Access Memory), including clock terminals 11a and 11b, command terminals 12a to 12e, an address terminal 13, a data input/output terminal 14, and power source terminals 15a to 15c, as external terminals. Although the semiconductor memory device 10 further includes a data strobe terminal, a reset terminal, a calibration terminal and the like, these terminals are omitted in FIG. 1.

The clock terminals 11a and 11b are supplied with external clock signals CK and /CK, respectively. The external clock signals CK and /CK are then supplied to a clock input circuit 21. A signal with "/" attached at the head in this specification means that the signal is an inverted signal of its corresponding signal or an active-low signal. Therefore, the external clock signals CK and /CK are mutually complementary signals. The clock input circuit 21 generates an internal clock ICLK based on the external clock signals CK and /CK, and supplies it to each block in the semiconductor memory device 10.

The command terminals 12a to 12e are terminals to which a row address strobe signal/RAS, a column address strobe signal/CAS, a write enable signal/WE, a chip select signal/CS, and an on-die termination signal ODT are supplied, respectively. Command signals CMD including these command signals are supplied to a command input circuit 31. The command signals CMD supplied to the command input circuit 31 are then supplied to a command decoder 32. The command decoder 32 generates various internal commands ICMD by holding, decoding, and counting the command signals. The internal commands ICMD are then supplied to a row saving circuit 90, a column saving circuit 92, a mode register 94 and the like.

The address terminal 13 is a terminal to which an address signal ADD is supplied. The address signal ADD is then supplied to an address input circuit 41. An output of the address input circuit 41 is supplied to an address latch circuit 42. Among the address signal ADD latched in the address latch circuit 42, a row address XA is supplied to the row saving circuit 90 and a row decoder 61, and a column address YA is supplied to the column saving circuit 92 and a column decoder 62. In addition, when a mode register set is activated, the address signal ADD is supplied to the mode register 94, by which contents of the mode register 94 are updated.

The row decoder 61 selects any one of a plurality of word lines WL included in a memory cell array 70 based on the row address XA included in the address signal ADD. In the memory cell array 70, a plurality of word lines WL and a plurality of bit lines BL intersect with each other, and a memory cell MC is arranged at every intersection of the word lines WL with the bit lines BL (however, only one word line WL, one bit line BL, and one memory cell MC are shown in FIG. 1). Each of the bit lines BL is connected to its corresponding sense amplifier SA included in a sense circuit 63.

The column decoder 62 selects any one of the sense amplifiers SA included in the sense circuit 63, that is, a bit line BL to be subject to a data access, based on the column address YA included in the address signal ADD. The sense amplifier SA selected by the column decoder 62 is connected to a data input/output circuit 80. With this configuration, a memory cell MC that is an access target is connected to the data input/output terminal 14 via the data input/output circuit 80.

The semiconductor memory device 10 further includes the row saving circuit 90 and the column saving circuit 92. The row saving circuit 90 determines whether the input row address XA is a defective address, and when it is a defective address, activates a redundant row decoder unit 68 included in the row decoder 61. Similarly, the column saving circuit 92 determines whether the input column address YA is a defective address, and when it is a defective address, activates a redundant column decoder unit 66 included in the column decoder 62.

The row saving circuit 90 and the column saving circuit 92 are connected to the power source terminals 15a to 15c via program voltage lines 16a and 16b and a reference voltage line 18. From the power source terminal 15a, a program voltage VPPSVT(A) is supplied via the program voltage line 16a. From the power source terminal 15b, a program voltage VPPSVT(B) is supplied via the program voltage line 16b. The program voltage VPPSVT(A) can be the same as the program voltage VPPSVT(B) in magnitude.

Each of the row saving circuit 90 and the column saving circuit 92 includes a plurality of antifuse elements AF, and stores therein the defective address by logical states of the antifuse elements AF. Details on the row saving circuit 90 are explained later with reference to FIG. 3. A part of the memory cell array 70 constitutes a redundant cell unit 74 that is a set of redundant cells.

When the row address XA designated by the address signal ADD corresponds to a row address of a defective address, the row saving circuit 90 inputs an XHIT signal to the row decoder 61. At this time, the redundant row decoder unit 68 of the row decoder 61 does not select a word line WL corresponding to the defective cell, but selects a word line WL corresponding to a redundant cell, in other words, a word line WL that belongs to the redundant cell unit 74. The defective address and the redundant word line WL are associated with each other in advance.

A basic mechanism is the same for the column saving circuit 92. When the column address YA designated by the address signal ADD corresponds to a column address of a defective address, the column saving circuit 92 inputs a YHIT signal to the column decoder 62. At this time, the redundant column decoder unit 66 of the column decoder 62 does not select the sense amplifier SA corresponding to the defective cell, but selects the sense amplifier SA corresponding to a redundant cell, that is, the sense amplifier SA that belongs to a redundant sense circuit unit 76. This means that the redundant column decoder unit 66 selects a bit line BL that belongs to the redundant cell unit 74. The defective address and the redundant sense amplifier SA are also associated with each other in advance. With this mechanism, even when an access to the defective address occurs, the access is not actually led to the defective cell, because the access is replaced with an access to the redundant cell.

The mode register 94 is a register for setting an operation mode of the semiconductor memory device 10. In the present embodiment, the write signal AFWRT is asserted from the mode register 94 to the row saving circuit 90 and the column saving circuit 92 at a time of programming. At this time, the row saving circuit 90 and the column saving circuit 92 selectively performs the insulation-breakdown on the antifuse elements AF. Details on this point are described later.

Figure 2:
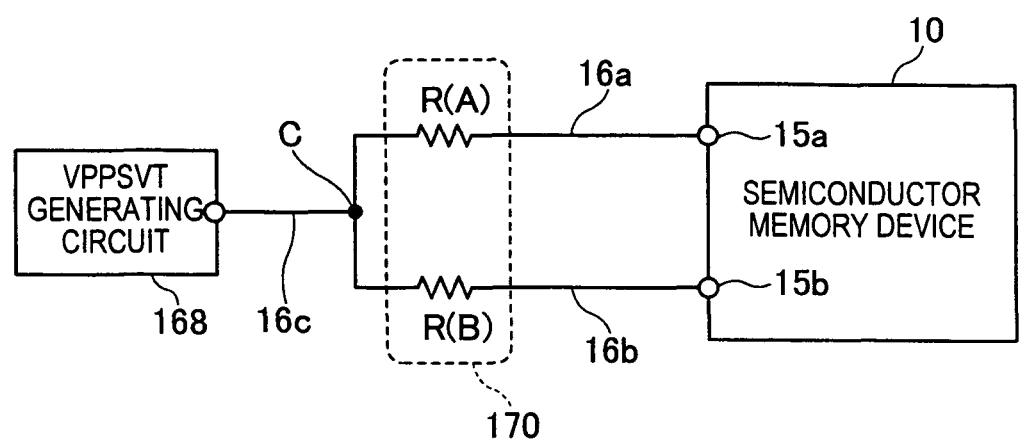
FIG. 2 is a system configuration diagram showing a relationship between the semiconductor memory device and a VPPSVT generating circuit.

FIG. 2 is a system configuration diagram showing a relationship between the semiconductor memory device 10 and a VPPSVT generating circuit 168. As described above, two types of program voltages VPPSVT(A) and VPPSVT(B) are supplied to the semiconductor memory device 10 from two voltage lines of the program voltage lines 16a and 16b. The VPPSVT generating circuit 168 generates the program voltage VPPSVT. A program voltage line 16c connected to the VPPSVT generating circuit 168 is branched into the program voltage lines 16a and 16b at a branch point C, which are connected to the power source terminals 15a and 15b of the semiconductor memory device 10, respectively. The resistors R(A) and R(B) are inserted to the program voltage lines 16a and 16b, respectively. The resistor R(A) can be the same as the resistor R(B) in magnitude.

A combination of the resistors R(A) and R(B) functions as a suppression circuit 170. Even when a potential of the power source terminal 15a shows a sudden drop, a potential of the branch point C never drops excessively because of a presence of the resistor R(A). As a result, it is possible to suppress a potential drop at the power source terminal 15b when the potential of the power source terminal 15a drops. That is, it becomes easy to suppress an influence of a potential of one of the power source terminals 15a and 15b on a potential of the other by the presence of the suppression circuit 170 (resistors R(A) and R(B)).

An overall configuration of the semiconductor memory device 10 according to the present embodiment is as described above. Although explanations are given below for the row saving circuit 90, the configuration and operation principle of the column saving circuit 92 are basically the same as those of the row saving circuit 90.

Figure 3:
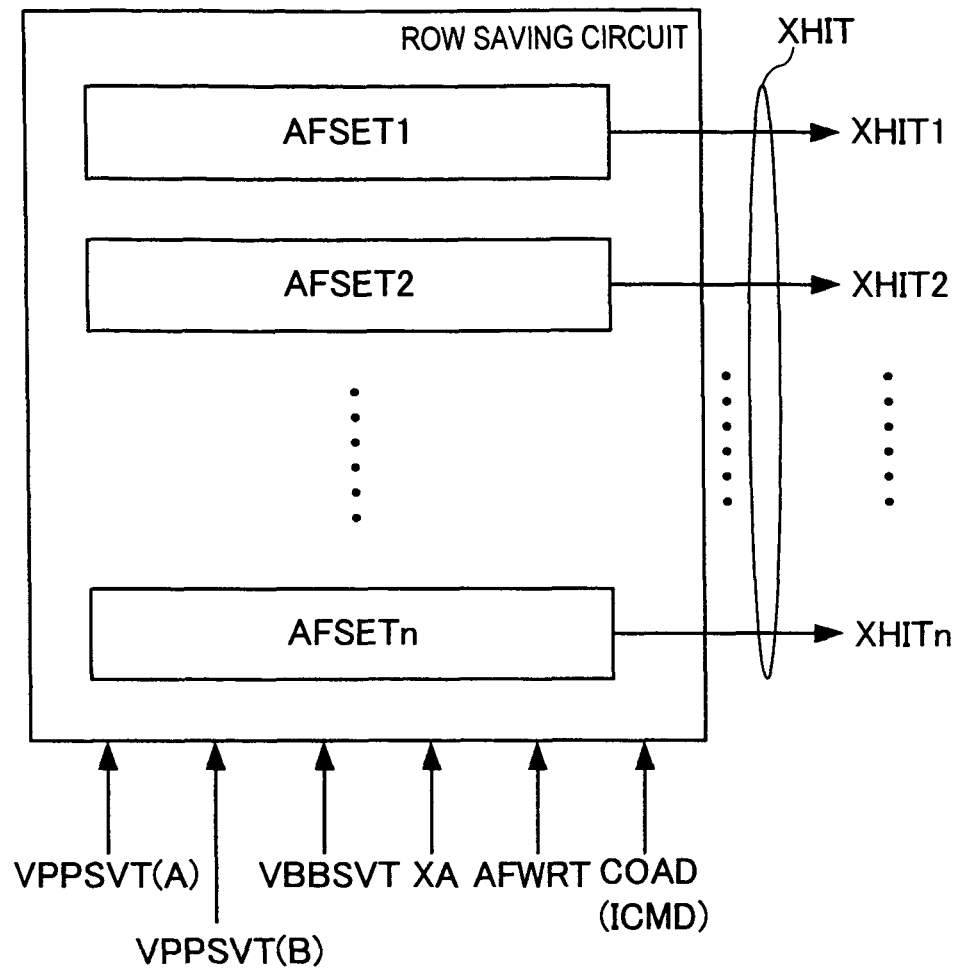
FIG. 3 is a block diagram showing a circuit configuration of the row saving circuit.

FIG. 3 is a block diagram showing a circuit configuration of the row saving circuit 90. The row saving circuit 90 includes a plurality of antifuse element sets AFSET for storing the defective address. Each defective address (row address) is stored in each of the antifuse element sets AFSET. The antifuse element sets AFSET are circuits for storing the defective address in a nonvolatile and irreversible manner. Although the specific number of antifuse element sets AFSET varies from product to product, for example, about 1200 sets are provided. In this case, the row saving circuit 90 can store therein 1200 defective addresses.

When the write signal AFWRT is asserted in a state where the row address is supplied and an antifuse element set AFSET1 is selected, the row address is programmed in the antifuse element set AFSET1. The programming is performed at a time of manufacturing the semiconductor memory device 10.

When a load signal LOAD, which is a sort of the internal command ICMD, is asserted in a state where the row address is supplied, each of the antifuse element sets AFSET determines whether the row address matches a registered row address (a defective address). For example, if the row address matches the registered row address in the antifuse element set AFSET1, the antifuse element set AFSET1 asserts an XHIT1 signal. With this operation, the row decoder 61 at the subsequent stage can recognize an occurrence of an access to the defective address.

Figure 4:
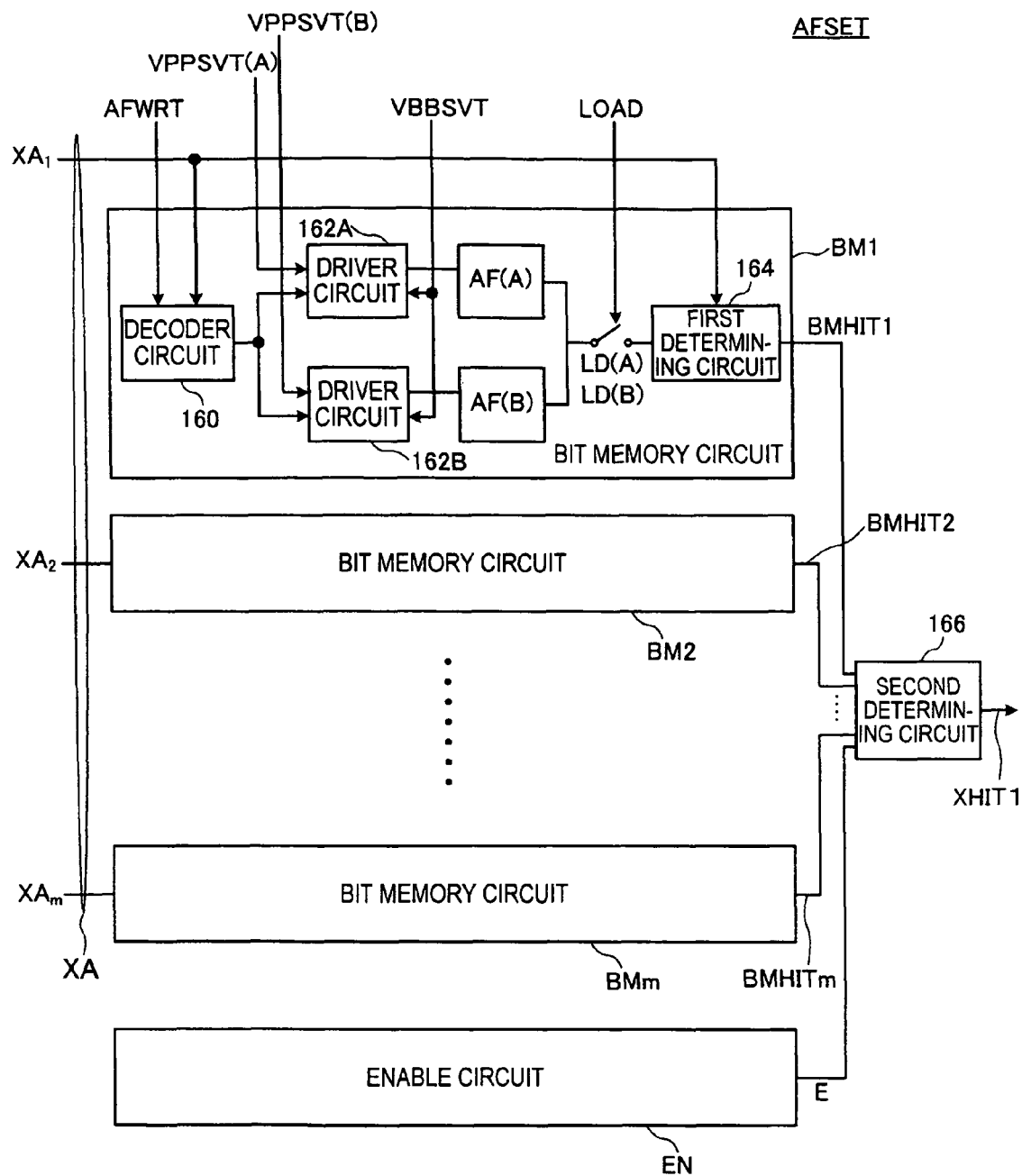
FIG. 4 is a block diagram showing a circuit configuration of an antifuse element set.

FIG. 4 is a block diagram showing a circuit configuration of an antifuse element set AFSET. The antifuse element set AFSET includes a plurality of bit memory circuits BM and an enable circuit EN. The bit memory circuits BM and the enable circuit EN are circuits that include a plurality of antifuse elements AF. Each of the bit memory circuits BM stores therein 1-bit data. In the example shown in FIG. 4, the antifuse element set AFSET includes m bit memory circuits BM (where m is a positive integer). That is, the number of bits of the row address is m bits or less. The enable circuit EN is a circuit that indicates whether the antifuse element set AFSET is active. When the antifuse element set AFSET is active, the enable circuit EN activates an enable signal E.

Each of the bit memory circuit BM corresponds to the antifuse memory circuit 150 or 152. However, the bit memory circuits BM are different from the antifuse memory circuits 150 and 152 in that a plurality of antifuse elements AF are assigned to one decoder circuit 160. The write signal AFWRT and the row address XA are input to the decoder circuit 160. Two driver circuits 162A and 162B are commonly connected to the single decoder circuit 160. The program voltage VPPSVT(A) and the reference voltage VBBSVT are supplied to the driver circuit 162A via the program voltage line 16a and the reference voltage line 18. The program voltage VPPSVT(B) and the reference voltage VBBSVT are supplied to the driver circuit 162B via the program voltage line 16b and the reference voltage line 18.

The antifuse elements AF(A) and AF(B) are connected to the driver circuits 162A and 162B, respectively. The antifuse elements AF(A) and AF(B) are commonly connected to a first determining circuit 164 via load transistors LD(A) and LD(B). When the load signal LOAD is input from the command decoder 32, both the load transistors LD(A) and LD(B) are switched on, and the antifuse elements AF(A) and AF(B) and the first determining circuit 164 are electrically connected to each other. The row address XA is input to the first determining circuit 164. The first determining circuit 164 compares detected potentials from the antifuse elements AF(A) and AF(B) with corresponding bits of the row address XA, and when the logical states match each other, asserts a BMHIT1 signal.

The bit memory circuits BM are commonly connected to a second determining circuit 166. The second determining circuit 166, when all BMHIT signals from all the bit memory circuits BM are asserted and the enable signal E is activated, asserts the XHIT1 signal.

For explaining a programming method, it is assumed that the write signal AFWRT is asserted in a state where a bit string of m bits, where row address XA="1011 . . . ", is designated. In this example, the row address is stored in the antifuse element set AFSET1. Bit memory circuits BM1 to BMm included in the antifuse element set AFSET1 correspond to first to m-th bits of the row address, respectively.

The decoder circuit 160 of the bit memory circuit BM1 activates both the driver circuits 162A and 162B to store the first "1 (second logical state)", and writes "1" by performing the insulation-breakdown of the gate insulation layers of the antifuse elements AF(A) and AF(B). Because the second bit is "0", the decoder circuit 160 of the bit memory circuit BM2 does not activate the driver circuits 162A and 162B. The bit memory circuits BM3 and BM4 write "1" by performing the insulation-breakdown on the antifuse elements AF. In this manner, the row address portion of the defective address is written in the m bit memory circuits BM included in the antifuse element set AFSET1. The column address portion is written in the antifuse element set AFSET included in the column saving circuit 92.

The antifuse element set AFSET included in the row saving circuit 90 corresponds to one defective row address. The redundant row decoder unit 68 of the row decoder 61 associates the redundant word line WL for each of the antifuse element sets AFSET.

Subsequently, it is assumed that an address signal ADD including the row address XA="1011 . . . " mentioned above is designated as an access destination, as an example for explaining a processing method when an access to the defective address occurs. The load signal LOAD is asserted at a time of the access. The antifuse element sets AFSET of the row saving circuit 90 check if the designated row address XA is stored therein. The first determining circuit 164 of the bit memory circuit BM1 of the antifuse element set AFSET1 detects "0" if both the antifuse elements AF(A) and AF(B) are in the first logical state (an initial insulation state) and "1" if at least one of them is in the second logical state (a conductive state). When the detected value matches the first bit of the row address XA, the first determining circuit 164 asserts the BMHIT1 signal. When BMHIT1 to BMHITm signals are all asserted, that is, when the row address stored in the antifuse element set AFSET1 completely matches the input row address XA, the second determining circuit 166 asserts the XHIT1 signal. With this operation, the redundant row decoder unit 68 of the row decoder 61 activates a redundant word line WL corresponding to the antifuse element set AFSET1.

Figure 5:
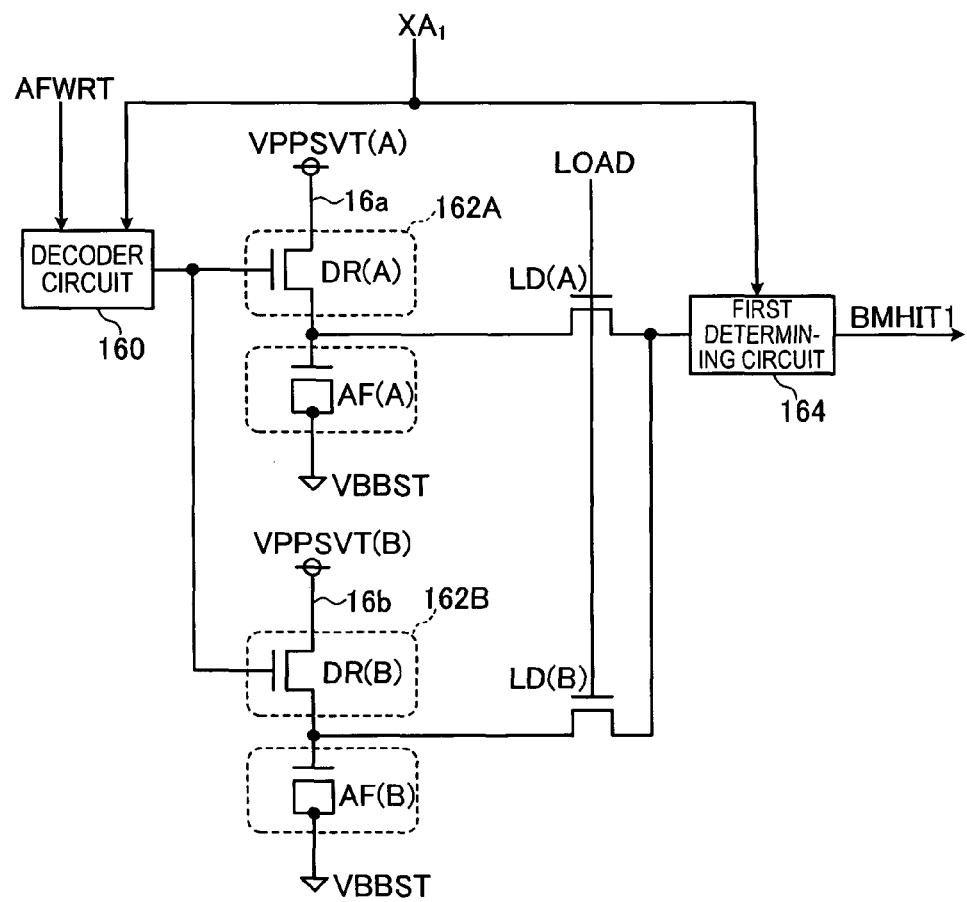
FIG. 5 is a circuit diagram of the bit memory circuit BM1.

FIG. 5 is a circuit diagram of the bit memory circuit BM1. The bit memory circuit BM1 according to the present embodiment is different from the antifuse memory circuits 150 and 152 explained with reference to FIGS. 10 and 11, respectively, in which the total number of decoder circuits 160 is restricted to assign the single decoder circuit 160 to a plurality of antifuse elements AF. A configuration itself of the decoder circuit 160 can be a known configuration such as the one described in Japanese Patent Application Laid-open No. 2007-80302. When the write signal AFWRT and a bit XA1 corresponding to the row address XA are input, the decoder circuit 160 determines whether to perform the insulation-breakdown on the antifuse elements AF(A) and AF(B). Upon determining to perform the insulation-breakdown, the decoder circuit 160 simultaneously switches on the driver transistors DR(A) and DR(B). With the driver transistors DR(A) and DR(B) switched on, the insulation-breakdown of the gate insulation layers of the antifuse elements AF(A) and AF(B) is performed by the program voltages VPPSVT(A) and VPPSVT(B) supplied from the power source terminals 15a and 15b, respectively. The states of the antifuse elements AF(A) and AF(B) are changed from the first logical state "0" to the second logical state "1". In this manner, because the single decoder circuit 160 controls all the antifuse elements AF(A) and AF(B) in a collective manner, the speed of the programming is increased.

Unlike the antifuse memory circuits 150 and 152, the program voltage line 16a for the antifuse element AF(A) and the program voltage line 16b for the antifuse element AF(B) are separated from each other. Therefore, even when the insulation-breakdown of one of the antifuse elements AF(A) and AF(B) fails, it is possible to retry the insulation breakdown. For example, assume that the insulation-breakdown of the antifuse element AF(B) fails while the insulation breakdown of the antifuse element AF(A) is successful. In this case, the decoder circuit 160 switches on the driver transistors DR(A) and DR(B) again. Although the antifuse element AF(A) is already in the conductive state, because the program voltage line 16b is a separate line from the program voltage line 16a, antifuse element AF(B) is not substantially influenced by the state of the antifuse element AF(A). In other words, the program voltage VPPSVT(B) is not affected by the program voltage line 16a. Therefore, even if it is the second time being switched on, it is possible to supply the program voltage VPPSVT(B) that is sufficient to achieve the insulation-breakdown of the antifuse element AF(B). Although the antifuse elements AF(A) and AF(B) share the reference voltage line 18 according to the present embodiment, a separate voltage line for the reference voltage VBBSVT can be used for each of the antifuse elements AF, similarly to the program voltage lines 16a and 16b.

Figure 10:
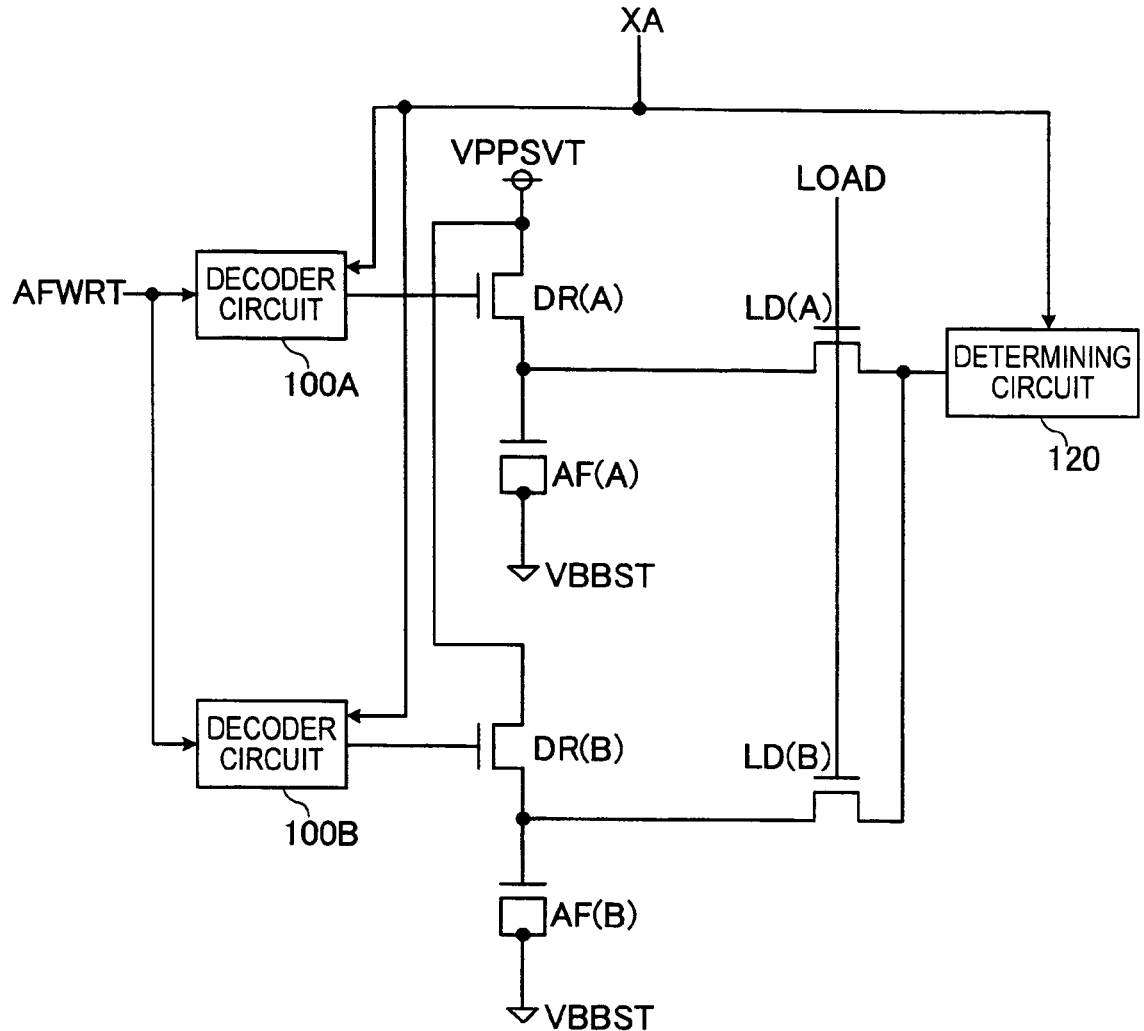
FIG. 10 is a circuit diagram showing an example of a conventional antifuse memory circuit in which two antifuse elements are assigned per bit.
Figure 11:
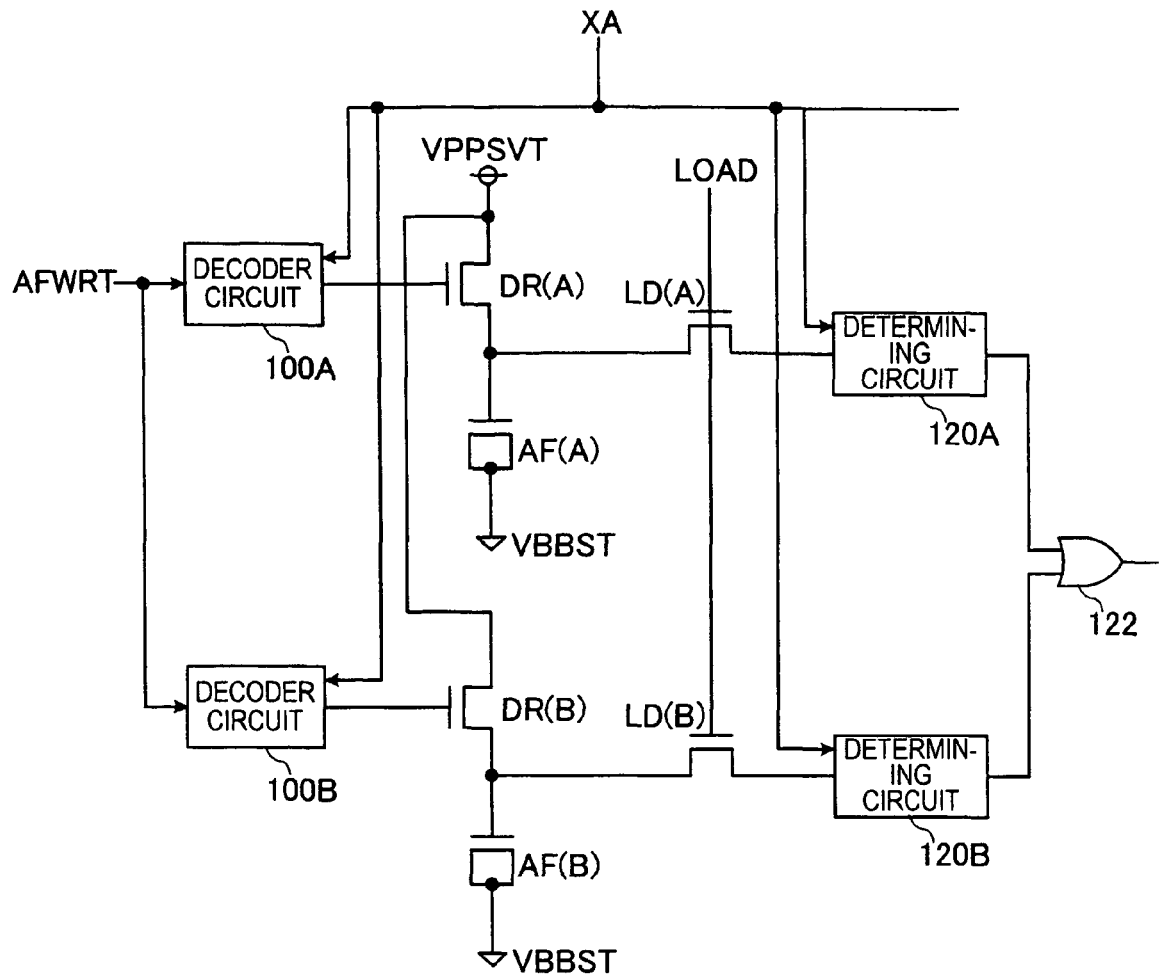
FIG. 11 is a circuit diagram showing another example of a conventional antifuse memory circuit in which two antifuse elements are assigned per bit.

The first determining circuit 164 corresponds to the determining circuit 120 shown in FIGS. 10 and 11, which can be configured with a known circuit.

Figure 6:
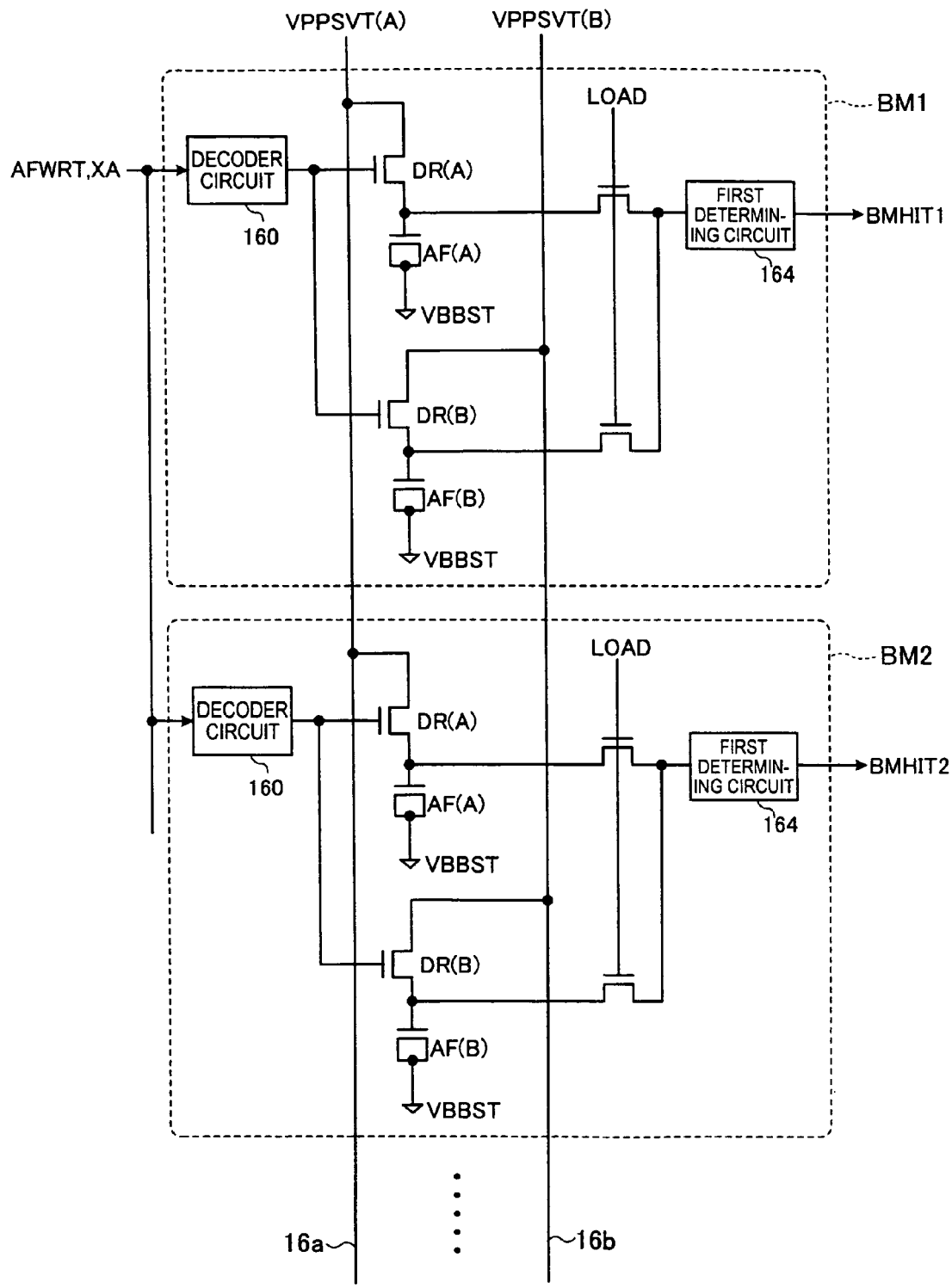
FIG. 6 is a circuit diagram of the antifuse element set.

FIG. 6 is a circuit diagram of the antifuse element set AFSET. As shown in FIG. 6, the program voltage line 16a for supplying the program voltage VPPSVT(A) to the antifuse element AF(A) among the two antifuse elements AF included in each of the bit memory circuits BM is shared by the bit memory circuits BM. The same goes for the antifuse element AF(B). As described above, the decoder circuit 160 to function as a selection circuit that selects a bit and executes the programming is independently provided for each of the bit memory circuits BM. On the other hand, the suppression circuit 170 explained with reference to FIG. 2 is a circuit that commonly works for the bit memory circuits BM.

As a circuit configuration for supplying the program voltage VPPSVT to the antifuse element AF, various configurations can be considered as well as the one shown in FIG. 2. Three types of configuration examples are shown in FIGS. 7 to 9.

Figure 7:
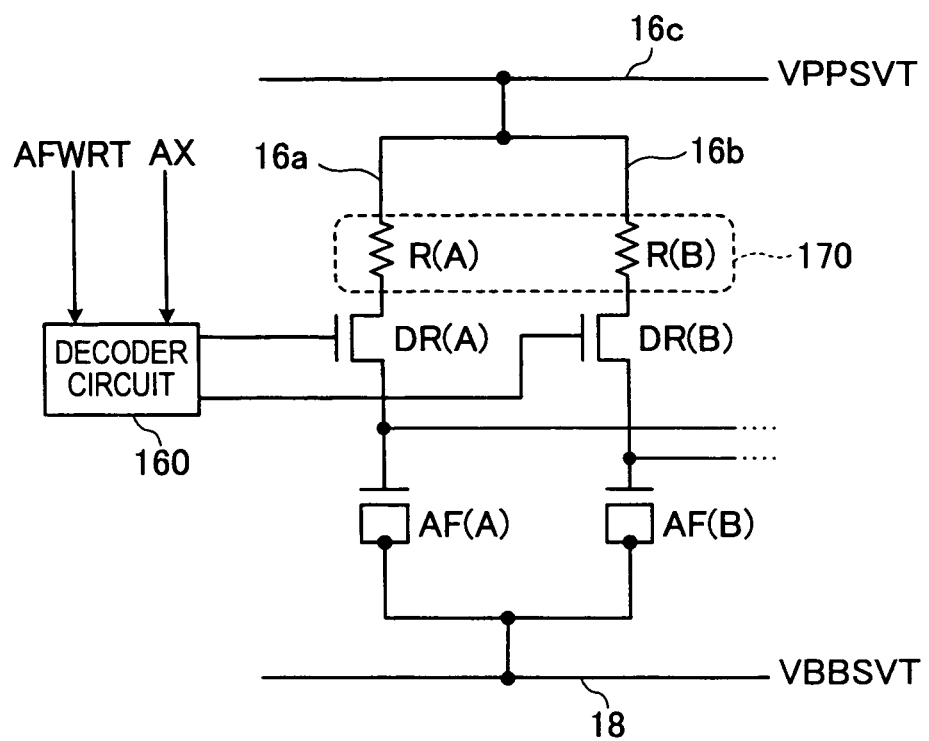
FIG. 7 is a schematic diagram showing a first configuration example of a circuit that supplies the program voltage to the antifuse element.

FIG. 7 is a schematic diagram showing a first configuration example of a circuit that supplies the program voltage to the antifuse element AF. In FIG. 7, the single program voltage line 16c is branched into the program voltage lines 16a and 16b in the semiconductor memory device 10, for example, in the bit memory circuit BM. The resistors R(A) and R(B) are inserted to the program voltage lines 16a and 16b, respectively. In this case, the combination of the resistors R(A) and R(B) functions as the "suppression circuit". In the case of the first configuration example, the power source terminals 15a and 15b can be provided as a common terminal. It suffices that the resistor R is a known resistor such as a tungsten resistor or a transistor resistor.

Also with the circuit configuration shown in FIG. 7, even when the insulation-breakdown of one of the antifuse elements AF(A) and AF(B) fails, it is possible to retry the insulation-breakdown. For example, assume that the insulation-breakdown of the antifuse element AF(B) fails while the insulation-breakdown of the antifuse element AF(A) is successful. In this case, the decoder circuit 160 switches on the driver transistors DR(A) and DR(B) again. Although the antifuse element AF(A) is already in the conductive state, the program voltage line 16a and the reference voltage line 18 are not short-circuited because of the presence of the resistor R(A). Therefore, even after the antifuse element AF(A) is made conductive, it is possible to supply the program voltage that is sufficient to achieve the insulation-breakdown of the antifuse element AF(B).

Figure 8:
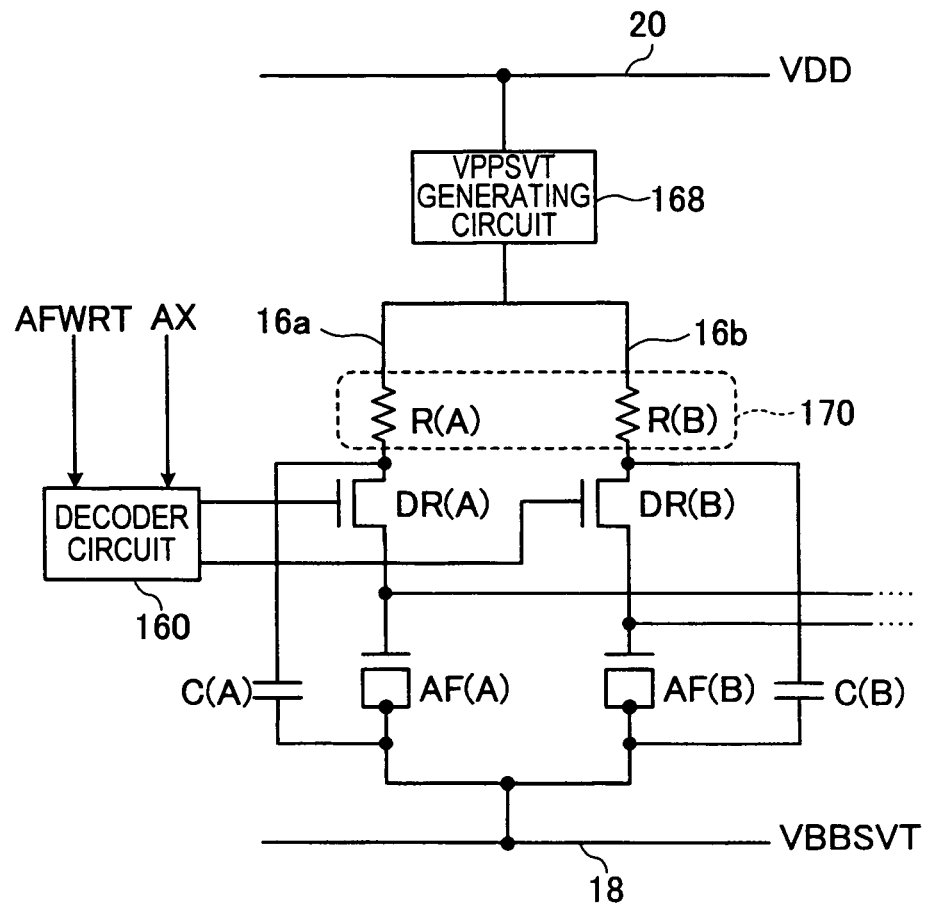
FIG. 8 is a schematic diagram showing a second configuration example of the circuit that supplies the program voltage to the antifuse element.
Figure 9:
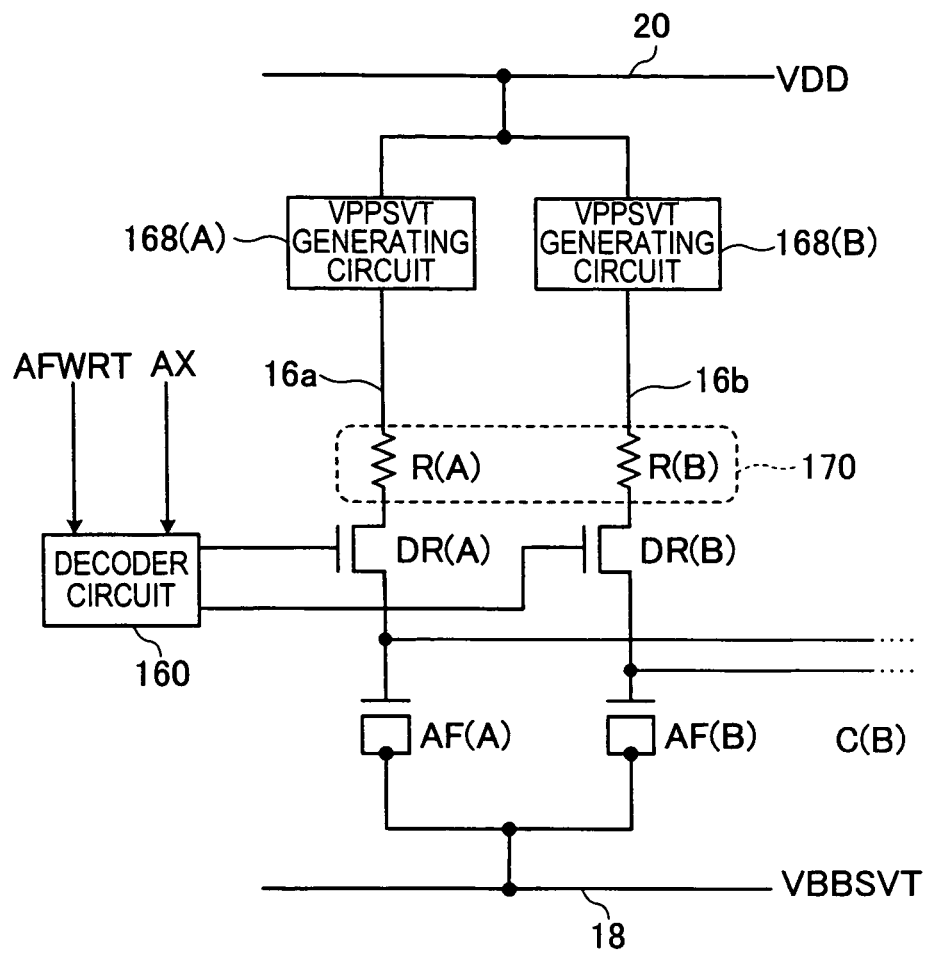
FIG. 9 is a schematic diagram showing a third configuration example of the circuit that supplies the program voltage to the antifuse element.

FIG. 8 is a schematic diagram showing a second configuration example of the circuit that supplies the program voltage to the antifuse element AF. In FIG. 8, an external voltage line 20 is branched into the program voltage lines 16a and 16b via the VPPSVT generating circuit 168. The resistors R(A) and R(B) are inserted to the program voltage lines 16a and 16b, respectively. In this case, the power source terminals 15a and 15b are not necessary. The VPPSVT generating circuit 168 generates the program voltage VPPSVT by voltage stepping up of the external voltage VDD. A bypass line including a capacitor C is provided to the driver transistor DR and the antifuse element AF. Also with the circuit configuration shown in FIG. 8, the VPPSVT generating circuit 168 and the reference voltage line 18 are not short-circuited because of the presence of the resistors R(A) and R(B). The VPPSVT generating circuit 168 can be configured by applying a known voltage step-up circuit or can be an independent power source.

FIG. 9 is a schematic diagram showing a third configuration example of the circuit that supplies the program voltage to the antifuse element AF. Also in FIG. 9, the external voltage line 20 is branched into the program voltage lines 16a and 16b. However, in FIG. 9, separate VPPSVT generating circuits 168(A) and 168(B) are inserted to the program voltage lines 16a and 16b, respectively. The resistors R(A) and R(B) are inserted between the VPPSVT generating circuits 168(A) and 168(B) and the driver transistors DR(A) and DR(B), respectively. As in FIG. 8, the bypass line including a capacitor C can be provided to the driver transistor DR and the antifuse element AF.

The semiconductor memory device 10 has been explained above while focusing on the circuit configuration of the antifuse element set AFSET. With the semiconductor memory device 10 according to the present embodiment, it is possible to reduce the number of decoder circuits 160 included in the antifuse element set AFSET. As compared to the circuit configurations shown in FIGS. 10 and 11, it becomes easy to suppress an increase of a circuit size of the semiconductor memory device 10 because an increase of the number of the decoder circuits 160 due to an increase of the number of the antifuse elements AF is suppressed. Because two or more driver transistors DR are simultaneously switched on by the single decoder circuit 160, the speed of the programming can be further increased.

When the program voltage line 16 is separated for each of the antifuse elements AF, it is possible to perform the insulation-breakdown a plurality of times for one bit memory circuit BM, and as a result, it becomes easy to perform the insulation-breakdown on the antifuse elements AF without fail.

While the present invention has been explained above based on embodiment, it will readily occur to those skilled in the art that the above embodiment—is only exemplary, various other changes and modifications can be made within the scope of the appended claims of the present invention, and those changes and modifications are also within the scope of the claims. Accordingly, it should be understood that the descriptions and drawings of the present specification are intended as illustrative of the invention, and not as limitative.

For example, although it is explained that the bit memory circuit BM for representing 1-bit data includes two antifuse elements AF, the 1-bit data can be represented by three or more antifuse elements AF. Furthermore, the single bit memory circuit BM can include two or more decoder circuits 160. For example, in a bit memory circuit BM that includes four antifuse elements AF, the decoder circuit 160 can be assigned to every two antifuse elements AF.

In the above embodiment, a case of applying the present invention to a DRAM has been explained. However, the application target of the present invention is not limited thereto, and the invention can be also applied to other types of semiconductor memory devices such as an SRAM and a flash memory. The present invention can be further applied to logic system semiconductor devices such as an MPU and a DSP (Digital Signal Processor).

While the above embodiment has explained that the bit memory circuit BM stores data therein by the antifuse elements, fuse elements can be used instead of the antifuse circuits for storing the data. The fuse element causes a change of state from a conductive state to an insulation state by programming, while the antifuse element causes a change of state from an insulation state to a conductive state by programming. It has nothing to do with the essence of the invention whether the state is changed from the conductive state to the insulation state or from the insulation state to the conductive state. It can be understood by those skilled in the art that the present invention can be applied to any element having an electrical characteristic that can be at least changed on a permanent basis as a result of programming.

What is claimed is:

1. A semiconductor device comprising:
   a fuse circuit that includes at least two fuse elements and that generates a signal taking a first logical level when all the fuse elements are in a first state and a second logical level when at least one of the fuse elements is in a second state;
   a selection circuit that simultaneously selects all the fuse elements based on select information;
   a programming circuit that applies a program voltage to selected fuse elements to cause each of the selected fuse elements to be in the second state; and
   a suppression circuit that suppresses transfer of a change of the program voltage with a change of a state of one of the fuse elements to the second state to other one of the fuse elements.

2. The semiconductor device as claimed in claim 1, wherein the suppression circuit includes a first resistive element connected between a node to which the program voltage is applied and one of the fuse elements, and a second resistive element connected between the node and other one of the fuse elements.

3. The semiconductor device as claimed in claim 1, wherein the at least two fuse elements comprise antifuse elements.

4. The semiconductor device as claimed in claim 1, wherein
   a plurality of sets of fuse circuits of a same type as the fuse circuit are provided,
   the program voltage is supplied to one of the fuse elements in each of the sets of fuse circuits via a first common voltage line,
   the program voltage is supplied to other one of the fuse elements in each of the sets of fuse circuits via a second common voltage line,
   the suppression circuit is commonly provided to the sets of fuse circuits, and the selection circuit is separately provided to the sets of fuse circuits.

5. A semiconductor device comprising:
   a first fuse element including a first end coupled to a first node;
   a second fuse element including a first end coupled to a second node;
   a circuit including an output terminal to program the first and second fuse elements in response to an input signal;
   a first transistor coupled between a first power supply line and the first end of the first fuse element and including a control terminal coupled to the output terminal; and
   a second transistor coupled between a second power supply line and the first end of the second fuse element and including a control terminal coupled to the output terminal.

6. The device according to claim 5, wherein each of the first and second fuse elements comprises a nonvolatile memory.

7. The device according to claim 5, wherein each of the first and second fuse elements comprises an anti fuse element.

8. The device according to claim 1, wherein the circuit writes the same data to the first and second fuse elements at the same time.

9. The device according to claim 1, wherein the decoder circuit the brings the first and second transistors into ON state at the same time.

10. The device according to claim 1, further comprising a first resistor connected in series between the first transistor and a third power supply line, and a second resistor connected in series between the second transistor and the third power supply line.

11. The device according to claim 10, wherein the circuit writes the same data to the first and second fuse elements at the same time.

12. The device according to claim 10, wherein the circuit brings the first and second transistors into ON state at the same time.

13. The device according to claim 1, wherein a second end of the first fuse element is coupled to a third power supply line differing from the first power supply line, and a second end of the second fuse element is coupled to the third power supply line, the second end of the first fuse element differs from the first end of the first fuse element, the second end of the second fuse element differs from the first end of the second fuse element.

14. The device according to claim 1, further comprising a third transistor connected to the first node and including a control terminal coupled to a control signal line, and a fourth transistor connected to the second node and including a control terminal coupled to the control signal line.

15. The device according to claim 5, further comprising: a determining circuit coupled to the first node, the second node and a signal line to compare a logic level determined by the first and second fuse elements and a logic level of the signal line and to output a result of comparison.

16. The device according to claim 5, wherein the circuit includes a decoder.

17. The device according to claim 5, wherein the input signal is at least a part of address signals.

18. The device according to claim 5, wherein the first power supply line differs from the second power supply line.

19. A semiconductor device including a plurality of bit memory circuits, each of the plurality of bit memory circuits comprising:
   a first fuse element including a first end coupled to a first node;
   a second fuse element including a first end coupled to a second node;
   a circuit including an output terminal to program the first and second fuse elements in response to an input signal;

a first transistor coupled between a first power supply line and the first end of the first fuse element and including a control terminal coupled to the output terminal; and a second transistor coupled between a second power supply line and the first end of the second fuse element and including a control terminal coupled to the output terminal.

20. The device according to claim 19, wherein each of the first and second fuse elements comprises a nonvolatile memory.

21. The device according to claim 19, wherein each of the first and second fuse elements comprises an anti fuse element.

22. The device according to claim 19, wherein the circuit writes the same data to the first and second fuse elements at the same time.

23. The device according to claim 19, wherein the circuit brings the first and second transistors into ON state at the same time.

24. The device according to claim 19, further comprising a first resistor connected in series between the first transistor and a third power supply line, and a second resistor connected in series between the second transistor and the third power supply line.

25. The device according to claim 24, wherein the circuit writes the same data to the first and second fuse elements at the same time.

26. The device according to claim 24, wherein the circuit brings the first and second transistors into ON state at the same time.

27. The device according to claim 19, wherein a second end of the first fuse element is coupled to a third power supply line differing from the first power supply line, and a second end of the second fuse element is coupled to the third power supply line, the second end of the first fuse element differs from the first end of the first fuse element, the second end of the second fuse element differs from the first end of the second fuse element.

28. The device according to claim 19, further comprising a third transistor connected to the first node and including a control terminal coupled to a control signal line, and a fourth transistor connected to the second node and including a control terminal coupled to the control signal line.

29. The device according to claim 19, further comprising: a determining circuit coupled to the first node, the second node and a signal line to compare a logic level determined by the first and second fuse elements and a logic level of the signal line and to output a result of comparison.

30. The device according to claim 19, wherein the circuit includes a decoder.

31. The device according to claim 19, wherein the input signal is at least a part of address signals.

32. The device according to claim 19, wherein the first power supply line differs from the second power supply line.

* * * * *